(12) United States Patent  (10) Patent No.: US 8,729,928 B2
Farnsworth  (45) Date of Patent: May 20, 2014

(54) SWITCHING CIRCUIT

(71) Applicant: NXP B.V., Eindhoven (NL)

(72) Inventor: Timothy Luke Farnsworth, Sheffield (GB)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/668,610

(22) Filed: Nov. 5, 2012

(65) Prior Publication Data

US 2013/0162325 A1  Jun. 27, 2013

(30) Foreign Application Priority Data

Dec. 22, 2011  (EP) ...................................... 11195388

(51) Int. Cl.
*H03K 3/00*  (2006.01)
(52) U.S. Cl.
USPC ............................................ 327/108; 326/83
(58) Field of Classification Search
USPC .................... 327/108–112; 326/82, 83, 87, 88
See application file for complete search history.

(56) References Cited

U.S. PATENT DOCUMENTS

| 4,628,218 | A | * | 12/1986 | Nakaizumi | ...................... | 326/33 |
| 6,363,029 | B1 | | 3/2002 | Watanabe et al. | | |
| 6,965,520 | B1 | * | 11/2005 | Seshadri et al. | ............... | 365/145 |
| 2002/0012413 | A1 | * | 1/2002 | Den Besten | ................... | 375/377 |

FOREIGN PATENT DOCUMENTS

| EP | 0 086 090 A1 | 8/1983 |
| EP | 0 279 332 A1 | 8/1988 |
| WO | 02/05427 A1 | 1/2002 |
| WO | 2007/072398 A2 | 6/2007 |

OTHER PUBLICATIONS

Data Sheet: JN5148-001 IEEE802.15.4 Wireless Microcontroller, NXP Laboratories UK, 100 pgs (2012).
Data Sheet: JN5142-J01 JenNet-IP Wireless Microcontroller, NXP Laboratories UK, 93 pgs (2012).
Extended European Search Report for European Patent Appln. No. 11195388.1 (Jun. 13, 2012).

* cited by examiner

*Primary Examiner* — William Hernandez

(57) ABSTRACT

A switching circuit suitable for a low power oscillator circuit includes control and output circuits, the control circuit arranged to control the output circuit, the control circuit having input and output terminals, the output circuit having input and output terminals and control terminals; wherein the input terminal of the control circuit is connected to the input terminal of the output circuit, and the control terminal of the output circuit is connected to the output terminal of the control circuit, the output circuit first switches connected in series and arranged such that in use at least one of the switches is in a low impedance state at any given time, and the control circuit has second switches connected in series and arranged such that in use at least one of the switches is in a low impedance state at any given time.

14 Claims, 3 Drawing Sheets

SWITCHING CIRCUIT

CROSS-REFERENCE TO RELATED APPLICATIONS

This application claims the priority under 35 U.S.C. §119 of European patent application no. 11195388.1, filed on Dec. 22, 2011, the contents of which are incorporated by reference herein.

FIELD OF THE INVENTION

This invention relates to a switching circuit. In particular it relates to a switching circuit for use in an oscillator circuit of a microcontroller. More particularly it relates to a switching circuit for use in a Low Power Radio Frequency (LPRF) microcontroller.

BACKGROUND OF THE INVENTION

LPRF microcontrollers are frequently used in low duty-cycle applications, an example of which is a battery powered light sensor. In such applications the light sensor may be controlled to take a measurement periodically and transmit the data based on that reading. Such an operation may take less than 10 ms. In such an application the electric current used will be dominated by the sleep or standby current. Therefore reduction of the sleep current in such microcontrollers may prove valuable for improving battery lifetimes.

When a microcontroller goes to sleep it may typically disable all circuitry except a sleep timer consisting of a low power sleep oscillator and a counter which is preloaded with a value corresponding to the sleep period. For example if the sleep oscillator is running at a frequency 32 Khz and a sleep period of one minute is required then the counter value would need to be 32000*60=1,920,000. The system would load the counter with this value, enable the oscillator circuit and then go to sleep by disabling all other circuitry to save power. For each oscillator period the counter will decrement until it reaches zero at which point an interrupt will be triggered which wakes the microcontroller up. During the sleep period the current consumption may be dominated by the sleep oscillator circuit.

An example of a known sleep oscillator is shown in FIG. 1 with corresponding voltage and current waveforms $V_A$, $V_B$, $V_C$, $V_D$, $V_E$, $I_C$, $I_D$ shown in FIG. 2. For brevity the main RC relaxation oscillator is not shown, however this is arranged to generate a signal $V_A$ which is a triangular signal of a few hundred mV. This signal is passed to a comparator circuit of the sleep oscillator which feeds into a series of Inverters 1, 2 to generate the final output clock signal. This clock signal is then used to drive sleep timers and associated logic in the microcontroller. It will be appreciated by the skilled person that the Inverters 1, 2 shown in FIG. 1 are implemented as cmos inverters, however, alternative implementations are also possible.

Waveform $I_D$ in FIG. 2 shows the current through Inverter 1, it can be seen that the current is zero for most of the cycle but as the input signal changes it rises up to a maximum value before dropping down to zero again. This effect is termed "shoot through current" and is caused when the input signal to Inverter 1 reaches a value where both the nmos and pmos devices are simultaneously turned on and conducting current. Note that there is a parasitic capacitance at the node $V_D$, mostly due to the gate capacitance of the transistors in Inverter 2, which causes $V_D$ to rise/fall at a finite rate depending on the amount of current that can be supplied by Inverter 1. As shown in FIG. 2 $V_D$ has a shorter rise/fall time than $V_C$ and the shoot through current $I_E$ of Inverter 2 is present for a shorter time than that of inverter 1 and reaches a lower maximum value.

The final output signal $V_E$ must be of full amplitude with a high voltage close to Vdd and a low voltage close to a ground GND (or Vss) so that it can be used to drive logic gates, similarly the signal edges must have a fast rise and fall time and a strong drive strength so that the preceding logic gates switch quickly with minimum shoot through current. Note that there will also be a parasitic capacitance at node $V_E$ due to any subsequent logic gates, we could therefore improve the output edge speed at $V_E$ by increasing the width of the devices in Inverter 2 so that they could drive more current and charge/discharge this capacitance quicker, however making these devices larger would increase the parasitic capacitance at the input of Inverter 2 meaning that the rise/fall time of $V_D$ would then be reduced leading to a larger shoot through current in Inverter 2.

A chain of inverter stages can be used to sharpen up the edges of a signal so that the rise/fall time of the final stage is much less than the first stage. Each inverter stage has associated shoot through current which is undesirable. We can achieve the same output edge speed by using a chain of fewer inverters with increased width transistors, but due to the increased parasitic capacitance on the input of each stage we may find that the average current remains the same or even increases. It is necessary to generate the signal $V_E$ from $V_B$ using as little current as possible and in general we find that whilst this can be achieved using a chain of inverters there is a limitation on the minimum amount of current required. In addition this current is poorly defined and may change significantly with voltage, temperature and process variation.

SUMMARY OF THE INVENTION

The inverting circuit according to the present invention may overcome the above mentioned problems.

According to a first aspect of the invention there is provided a switching circuit suitable for a low power oscillator circuit, the switching circuit comprising; a control circuit and an output circuit, said control circuit arranged to control the output circuit, said control circuit having an input terminal and an output terminal, said output circuit having an input terminal, an output terminal and a plurality of control terminals; wherein the input terminal of the control circuit is connected to the input terminal of the output circuit, and the control terminal of the output circuit is connected to the output terminal of the control circuit, said output circuit comprising at a first plurality of switches connected in series and arranged such that in use at least one of said switches is in a low impedance state at any moment in time, and said control circuit comprises a second plurality switches connected in series and arranged such that in use at least one of said switches is in a low impedance state at any moment in time.

Preferably the output circuit further comprises control switches connected in series with the first plurality of switches, wherein said control switches are arranged to control the operation of the first plurality of switches. The switches of said control circuit and said output circuit are transistors switches, wherein said second plurality switches of said control circuit are arranged as a first inverter and said second plurality switches of said output circuit being arranged as a second inverter. The transistor switches are field effect transistors.

Preferably one of said control switches is connected between a supply voltage and a source connection of one of the transistors of the second inverter; and one of said control switches is connected between a source of one of the transistor of the second inverter and a ground. The output terminal of said control circuit is the output of the first inverter. Respective gates of the control switches are connected to the output terminal of said control circuit. The output terminal of said output circuit is the output of the second inverter. Preferably a capacitor is connected across the output terminal of said control circuit and said ground.

Preferably the output circuit further comprises; first and second current sources connected across the respective sources and drains of control transistors.

Preferably the control circuit further comprises a third current source connected in series between the supply line and the source of one of the transistors of the first inverter; and a fourth current source connected in series between a drain of one of the transistors of the first inverter and ground.

Preferably the control circuit is arranged to receive an input waveform having a rise time at said input terminal, and is further arranged to generate a respective control waveform; wherein said control waveform is inverted and delayed with respect to the input waveform and has a fall time greater than the rise time of the input waveform.

Preferably the output circuit is arranged to receive said input waveform having said rise time at said input terminal, and is further arranged to generate an output waveform having a fall time less than said control waveform. Preferably the gates of said control switches are arranged to receive said control waveform.

According to a second aspect there is provided an oscillator circuit comprising the switching circuit according to a first aspect.

BRIEF DESCRIPTION OF DRAWINGS

Embodiments are described hereinafter by way of example only with reference to the accompanying drawings in which:

In the figures and the following description like reference numerals refer to like features.

FIG. 3 shows a block diagram of the switching circuit 10. The switching circuit 10 has a first switching stage 12, operating as a control circuit which is connected to a second switching stage 14, operating as an output circuit. The first 12 and second 14 switching stages have common input nodes (or terminals) Vin such that the input signal applied to the first switching stage 12 is also applied to the second switching stage 14. An output terminal Vcont of the first switching stage 12 is connected to a control input terminal Vcont' of the second switching stage 14. By connecting the output Vcont of the first switching stage 12 to the control input terminal Vcont' of the second switching stage 14 it can be seen that the second switching stage 14 is controlled by the first switching stage 12. The first switching stage 12 also includes a delay mechanism (not illustrated in FIG. 3), which is discussed in more detail in relation to FIG. 4.

Referring now to FIG. 4, the first switching stage 12 includes first input transistors M1 and M2. By way of non-limiting example the first input transistors M1, M2 may be configured as a CMOS inverter 16. In this example input transistor M1 is a pMOS transistor and input transistor M2 is an nMOS transistor. Gate terminals of the input transistors M1 and M2 are connected together and serve as an input node Vin to the first switching stage 12 such that the input signal Vin is applied to both gates of the input transistors M1 and M2. Drain terminals of the input transistors M1 and M2 are also connected together and serve as an output node Vcont of the first switching stage 12. The output node Vcont is connected to the control node Vcont' on the second switching stage 14. A capacitor C1, which acts as a delay mechanism is connected between the output node Vcont' and a ground GND (or Vss) of the switching circuit 10. Source of the input transistor M1 is connected to a power supply line VDD via a current source Icharge1. Source of the input transistor M2 is connected to ground GND via a current source Icharge2.

The second switching stage 14 includes second input transistors M4 and M5. By way of non-limiting example the second input transistors may be configured as a CMOS inverter 18. In this example input transistor M4 is a pMOS transistor and input transistor M5 is an nMOS transistor. Gate terminals of the transistors M4 and M5 are connected and serve as an input node Vin for the second switching stage 12 such that the input signal Vin is applied to both the gates of first input transistors M1 and M2 and second input transistors M4 and M5. Drain terminals of the transistors M4 and M5 are also connected and serve as an output node Vout of the circuit 10. The source terminal of the transistor M4 is connected to a power supply line Vdd via a first control transistor M3. The source terminal of the transistor M5 is connected to ground GND via a second control transistor M6.

The source of second input transistor M4 is connected to the drain of the first control transistor M3. The drain of the transistor M3 is connected to the supply line Vdd. The gate terminal of the transistor M3 forms the node Vcont' which is connected to node Vcont of the first switching stage 12. A current source Ipull1 is connected in parallel across the drain and the source of transistor M3.

The source of second input transistor M5 is connected to the drain of the second control transistor M6. The source of transistor M6 is connected to ground GND. The gate terminal of the transistor M6 forms the node Vcont' which is connected to node Vcont of the first switching stage 12. A current source Ipull2 is connected in parallel across the drain and the source of second control transistor M6.

The skilled person will appreciate that the term ground, as used herein, is used to signify a voltage that is lower in the power supply voltage. Use of the term ground does not imply a zero voltage only, however this is contemplated.

Figure 4:
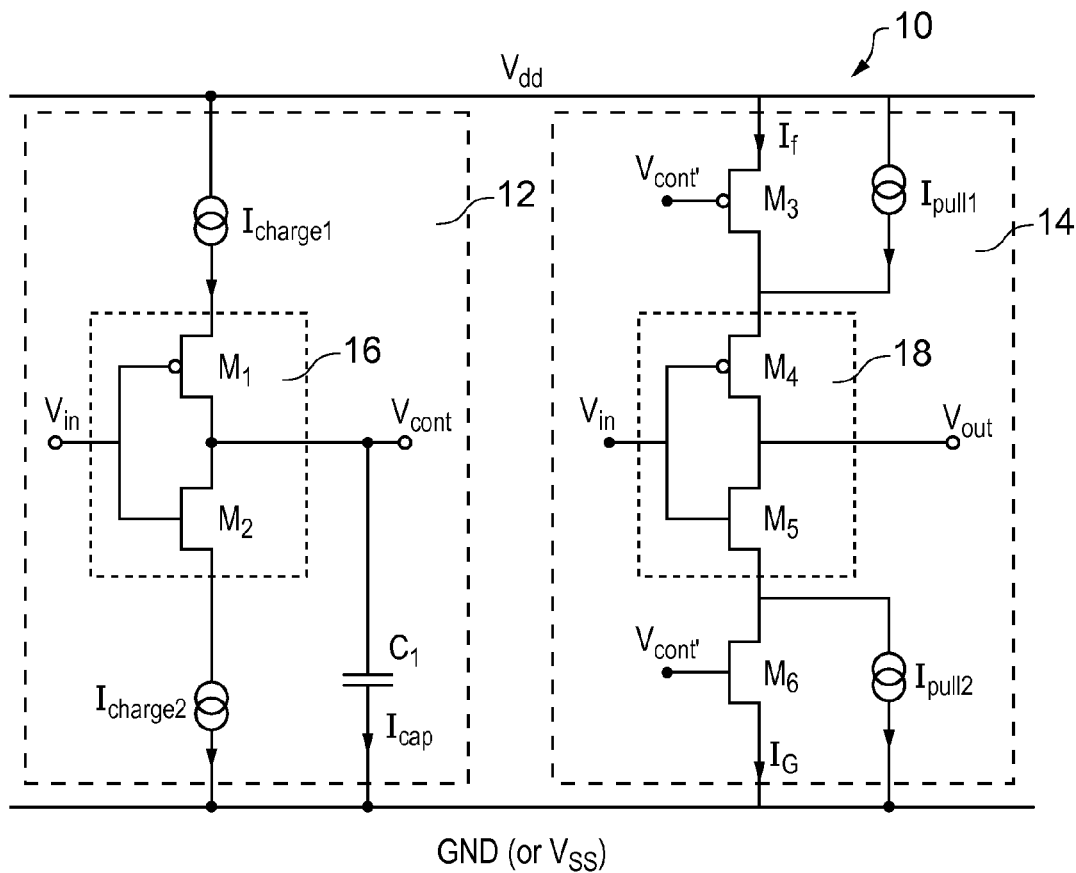
FIG. 4 is a schematic circuit diagram of a switching circuit according to an embodiment of the invention.
Figure 5:
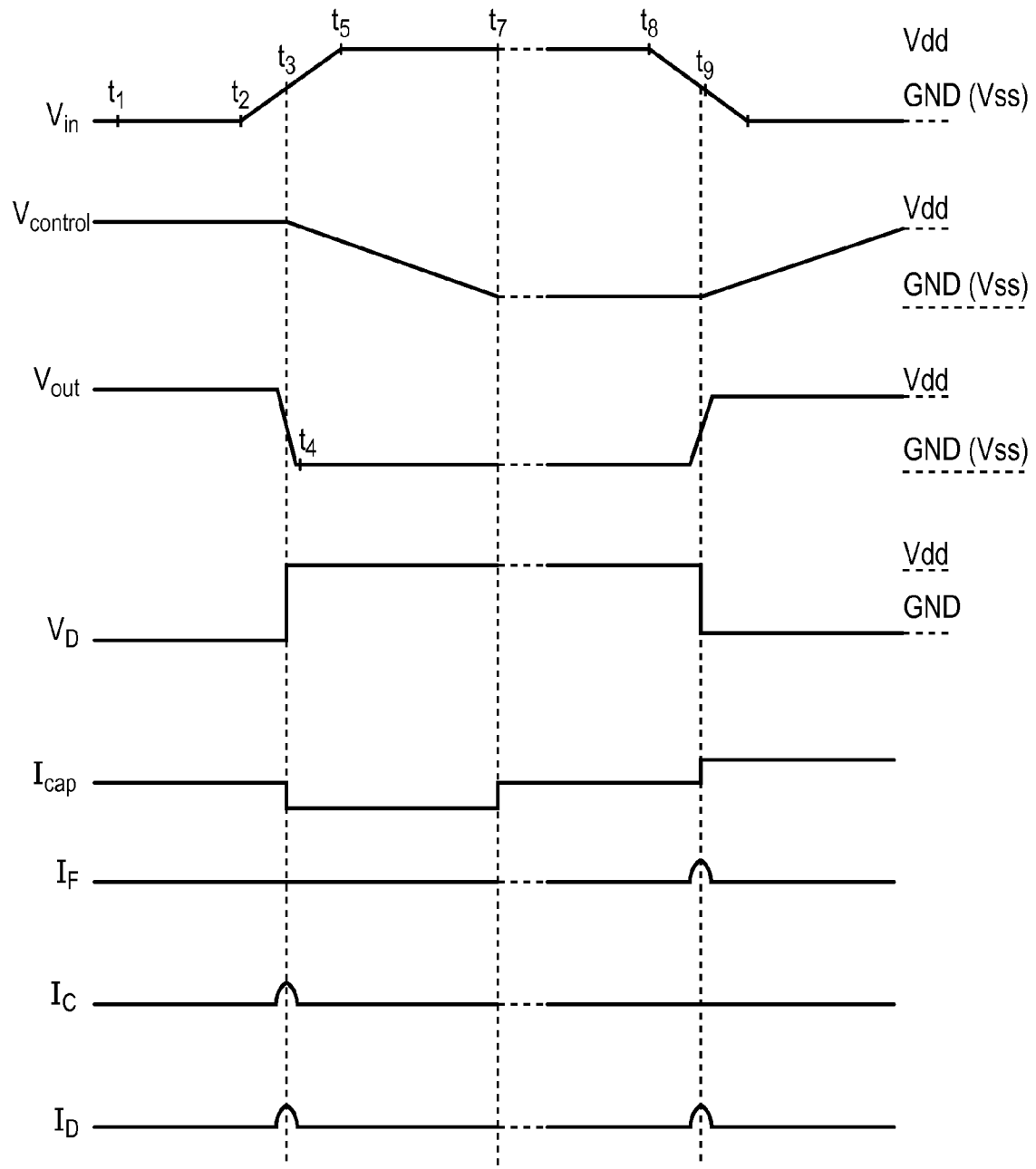
FIG. 5 is a timing diagram of voltages and currents of the switching circuit of FIG. 4.

With reference to FIGS. 4 and 5, the delay mechanism introduced by capacitor C1 causes a delay between the signal Vin and the signal Vcontrol. In this example the signal Vcontrol is an inverted form of the signal Vin. However, at the time t3 the point at which inverted signal Vcontrol starts to be inverted is delayed by a time t3–t2 due to the fact that no current will flow through the transistor M2 until signal Vin has exceed threshold the voltage of transistor M2. Conversely, at the time t9, the point at which the signal Vcontrol begins to rise is delayed by a time t9–t8 due to the threshold voltage of the transistor M1.

The operation of the circuit will now be described with reference to FIGS. 4 and 5. FIG. 5 shows the operation of the circuit. For the following initial analysis it can be assumed that transistors M1 to M6 can all conduct large currents. That is when turned on they act like ideal switches and source an infinite amount of current and that Ipull1 and 2 can be ignored The timescales of this FIG. 5 are more realistic than those of FIG. 2 with the time period being much longer than the edge speed of signal Vin.

Figure 2:
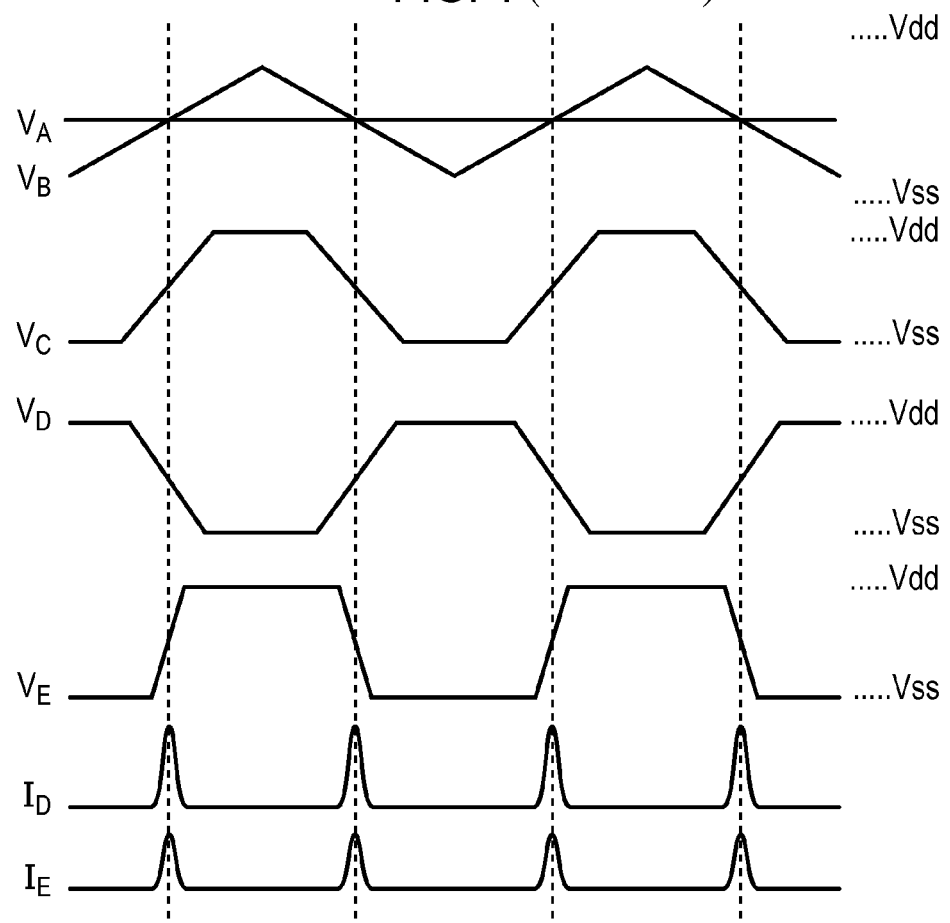
FIG. 2—is a timing diagram of the voltages and currents of the sleep oscillator of FIG. 1.
Figure 3:
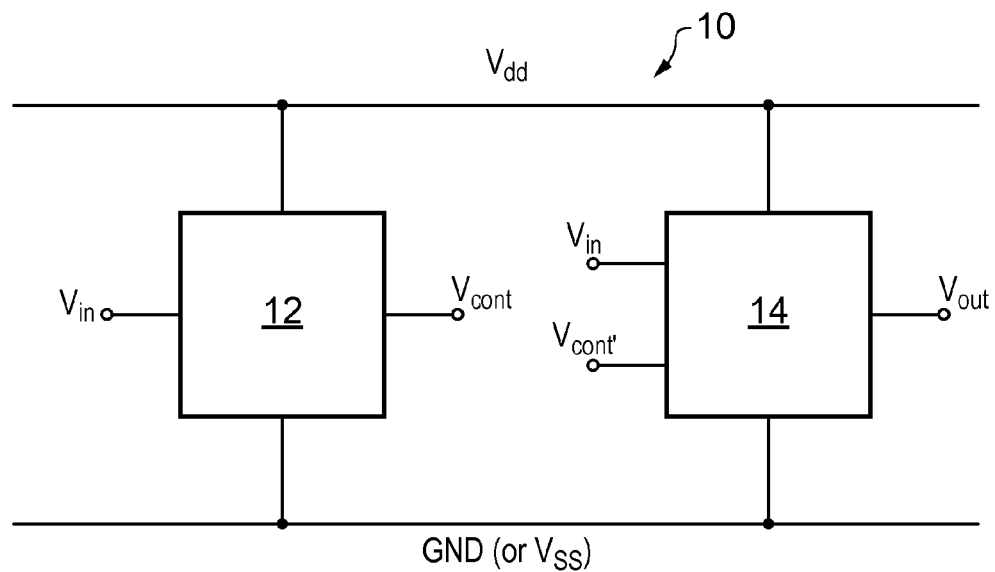
FIG. 3 is a block diagram of a switching circuit according to an embodiment of the invention.

It should be noted that the time scales in FIGS. 2 and 5 are not the same. FIG. 2 is illustrated to show slow edge speeds so that the effect of shoot through current could be more clearly illustrated. In other words signal Vin of FIG. 5 is $V_c$ of FIG. 2 expanded over the time axis.

At time t1 signal Vin is low so that the transistor M5 is off, transistor M4 is on and signal Vout is high. At time t2 signal Vin starts to rise up and at time t3 the threshold voltage of M5 is reached so it turns on. At this time signal Vcontrol is high so transistor M3 is off and transistor M6 on. Therefore, signal Vout is quickly pulled low by the current flowing through transistors M5 and M6, such that signal Vout reaches ground at time t4. At this time M2 also turns on causing capacitor C1 to discharge slowly due to Icharge2. At time t5 signal Vin reaches Vdd. At time t6 capacitor C1 reaches a voltage half that of Vdd (vdd/2) and at time t7 capacitor C1 will have discharged completely and signal Vcontrol will be low. At this time M6 will have now turned off and M3 will be on, such that the circuit is now ready for the next input edge. At time t8 Vin starts to fall and at time t9 the threshold voltage of M4 is reached so it turns on, M3 is on also and M6 off so signal Vout is quickly pulled high by the current flowing through M3 and M4, M1 also turns on at this point and signal Vcontrol starts to charge toward Vdd.

Ignoring the contribution of the current sources Ipull1 and Ipull2 there will be no shoot-through current in the circuit and the total charge drawn from signal Vout at each transition will be Q, where:

$$Q=C*dV$$

C is the load capacitance at Vout (not shown) and dV is the supply voltage Vdd.

Since Q is constant for each transition edge the average current flow at node Vout will be the same regardless of edge the rise/fall time of signal Vin. As a result, large width transistor devices can be used for transistors M4 and M5 to achieve short rise/fall times at node Vout without the problems associated with shoot through currents.

In practice there is a period of time between times t7 and t9 where node Vout is left floating in a high impedance state because both transistors M3 and M6 are turned off. Therefore, current sources Ipull1 and Ipull2 are used to hold signal Vout at Vdd or ground GND. As a result of the current sources there will be a small amount of shoot through current during switching of signal Vout however the shoot current will be limited to the amount of current provided by the current sources Ipull1 and Ipull2. Furthermore, because signal Vout switches quickly the amount of shoot through current is negligible.

At time t2 it is important that signal Vcontrol is at Vdd so that transistor M3 is turned off and transistor M6 turned on before the rising edge of signal Vin occurs, transistors M3 and M6 need to remain in this condition until after signal Vout has switched from high to low. At time t6 signal Vcontrol has dropped to vdd/2 and depending upon the threshold voltages of transistors M3 and M6 they will typically begin to turn on/off around this time until at time t7 transistor M3 is fully turned on and transistor M6 fully turned off and the circuit is now in the correct state to receive the falling edge of signal Vin. The rise and fall times of signal Vcontrol do not have to be very precise provided that time t6 occurs after signal Vin has reached Vdd and time t7 occurs before time t8. For example with a 32 Khz oscillator we will have time t8–t2 of around 16 μs and if signal Vin has a rise time of 2 μs then the rise/fall time of signal Vcontrol could be anywhere in the range from 2 to 15 μs. If the capacitor C1 is sized so that Icharge1 and Icharge2 are small, for example a few nA, then the amount of current used by the first switching stage 12 can be very small. Table 1 shows the switching states (on or off) for the transistors M1 to M6 at times t1 to t9.

TABLE 1

|    | M1  | M2  | M3  | M4  | M5  | M6  |
|----|-----|-----|-----|-----|-----|-----|
| t1 | on  | off | off | on  | off | on  |
| t2 | on  | off | off | on  | off | on  |
| t3 | off | on  | off | off | on  | on  |
| t4 | off | on  | off | off | on  | on  |
| t5 | off | on  | off | off | on  | on  |
| t6 | off | on  | —   | off | on  | —   |
| t7 | off | on  | on  | off | on  | off |
| t8 | off | on  | on  | off | on  | off |
| t9 | on  | off | on  | on  | off | off |

Figure 1:
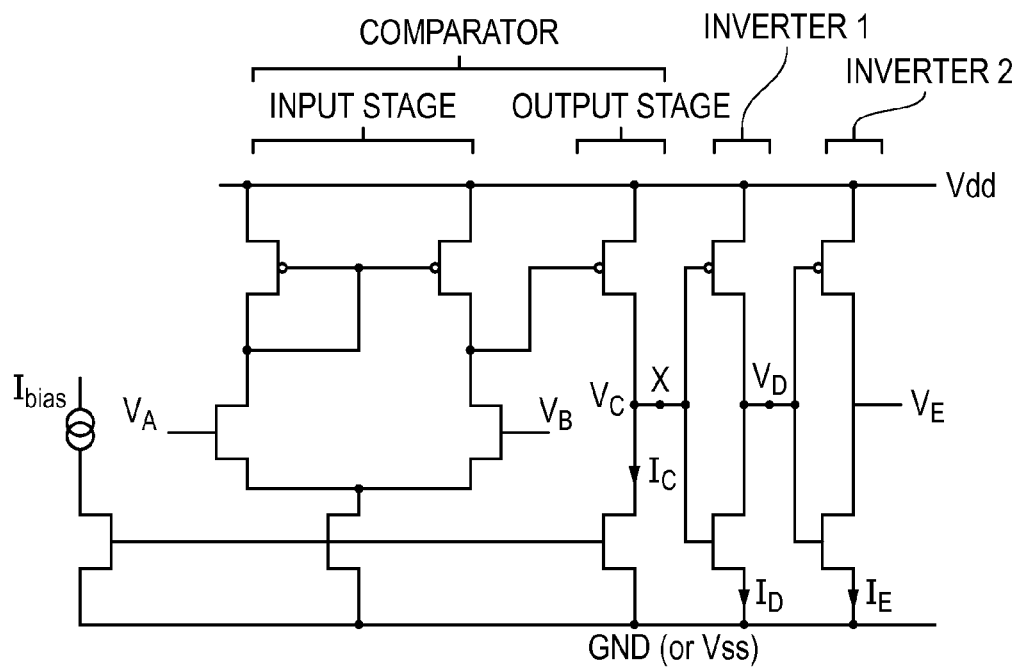
FIG. 1—is a schematic circuit diagram of a known sleep oscillator.

The switching circuit 10 can improve the edge speed of a signal using very small amounts of current as described above and as such can be used in any number of ultra-low power circuits. For example, the switching circuit 10 as described herein may be inserted at point x of the oscillator circuit of FIG. 1. Using the switching circuit in such applications means that the comparator stage illustrated in FIG. 1 uses less power because the speed of the output signal Vout edge is no longer a limiting factor, as discussed. This reduction combined with a substantial reduction in shoot through current may lead to a substantial reduction in operation current of the oscillator.

Whilst the above embodiments discuss implementations based on CMOS devices the skilled person will recognise that the embodiments may also be implemented using any appropriate switching means. Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

For the sake of completeness it is also stated that the term "comprising" does not exclude other elements or steps, the term "a" or "an" does not exclude a plurality, a single processor or other unit may fulfill the functions of several means recited in the claims and reference signs in the claims shall not be construed as limiting the scope of the claims.

The invention claimed is:

1. A switching circuit suitable for a low power oscillator circuit, the switching circuit comprising;
   a control circuit and an output circuit, said control circuit arranged to control the output circuit;
   said control circuit having an input terminal and an output terminal,
   said output circuit having an input terminal, an output terminal and a plurality of control terminals;
   wherein the input terminal of the control circuit is connected to the input terminal of the output circuit, and the control terminal of the output circuit is connected to the output terminal of the control circuit;
   said output circuit comprising a first plurality of switches connected in series and arranged such that in use at least one of said first plurality of switches is in a low impedance state at any moment in time, and
   said control circuit comprising a second plurality of switches connected in series and arranged such that in use at least one of said first plurality of switches is in a low impedance state at any moment in time; and
   wherein the output circuit further comprises a plurality of control switches connected in series with the first plurality of switches, wherein said control switches are arranged to control operation of the first plurality of switches.

2. The switching circuit of claim 1, wherein:
   one of said control switches is connected between a supply voltage and a source connection of one of the transistors of a second inverter; and
   one of said control switches is connected between a source of one of the transistors of the second inverter and a ground.

3. The switching circuit of claim 2, wherein the respective gates of the control switches are connected to the output terminal of said control circuit.

4. The switching circuit of claim 3, wherein said gates of said control switches are arranged to receive a control waveform.

5. The switching circuit of claim 1, wherein said switches of said control circuit and said output circuit are transistor switches, wherein said first plurality of switches of said control circuit are arranged as a first inverter and said second plurality of switches of said output circuit being arranged as a second inverter.

6. The switching circuit of claim 5, wherein the transistor switches are field effect transistors.

7. The switching circuit of claim 5, wherein the output terminal of said output circuit is the output of the second inverter.

8. The switching circuit of claim 5, the output circuit further comprising;
   first and second current sources connected across the respective sources and drains of said transistor switches.

9. The switching circuit of claim 1, wherein the output terminal of said control circuit is the output of a first inverter.

10. The switching circuit of claim 1, further comprising a capacitor connected across the output terminal of said control circuit and a ground.

11. The switching circuit of claim 1, the control circuit further comprising a third current source connected in series between a supply line and the source of one of the transistors of a first inverter; and a fourth current source connected in series between a drain of one of the transistors of the first inverter and ground.

12. The switching circuit of claim 1, wherein the control circuit is arranged to receive an input waveform having a rise time at said input terminal, and is further arranged to generate a respective control waveform;
    wherein said control waveform is inverted and delayed with respect to the input waveform and has a fall time greater than the rise time of the input waveform.

13. The switching circuit of claim 1 wherein the output circuit is arranged to receive an input waveform having a rise time at said input terminal, and is further arranged to generate an output waveform having a fall time less than a control waveform.

14. An oscillator circuit comprising the switching circuit of claim 1.

* * * * *